(12) United States Patent
Vinson et al.

(10) Patent No.: US 7,056,204 B2
(45) Date of Patent: Jun. 6, 2006

(54) AIR MOVER

(75) Inventors: Wade D. Vinson, Magnolia, TX (US);
Jeffery Michael Giardina, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/042,421

(22) Filed: Jan. 25, 2005

(65) Prior Publication Data

US 2005/0260944 A1 Nov. 24, 2005

Related U.S. Application Data

(60) Provisional application No. 60/573,508, filed on May 21, 2004.

(51) Int. Cl.
*H05K 5/02* (2006.01)

(52) U.S. Cl. ............. 454/184; 454/344; 361/695; 165/80.3

(58) Field of Classification Search ........... 361/695, 361/697; 165/0.2, 80.3; 454/184, 342, 344, 454/16; 110/162

See application file for complete search history.

(56) References Cited

U.S. PATENT DOCUMENTS

| | | | | |
|---|---|---|---|---|
| 1,314,563 A | * | 9/1919 | Axen | 110/162 |
| 1,391,645 A | * | 9/1921 | Wheller | 415/116 |
| 1,707,281 A | * | 4/1929 | Sauvage | 431/20 |
| 1,885,506 A | * | 11/1932 | Berchtold et al. | 110/162 |
| 2,300,578 A | * | 11/1942 | Lane | 110/162 |
| 2,561,135 A | * | 7/1951 | Resek | 110/162 |
| 6,031,721 A | | 2/2000 | Bhatia | |
| 6,262,892 B1 | | 7/2001 | Bhatia | |
| 6,299,408 B1 | | 10/2001 | Bhatia | |
| 6,411,509 B1 | * | 6/2002 | Chuang et al. | 361/695 |
| 6,592,448 B1 | * | 7/2003 | Williams | 454/184 |
| 2003/0153259 A1 | | 8/2003 | Lee et al. | |
| 2003/0155106 A1 | | 8/2003 | Malone et al. | |
| 2003/0169567 A1 | | 9/2003 | Tantoush et al. | |
| 2003/0184972 A1 | | 10/2003 | Saeki et al. | |
| 2003/0202878 A1 | | 10/2003 | Huang et al. | |
| 2004/0004813 A1 | | 1/2004 | Coglitore et al. | |
| 2004/0027804 A1 | * | 2/2004 | Chen | 361/695 |
| 2004/0246676 A1 | | 12/2004 | Barr et al. | |

\* cited by examiner

*Primary Examiner*—Gregory Wilson

(57) ABSTRACT

An air mover comprising a motor and a plurality of fan blades coupled to the motor. The motor is operable to rotate the fan blades about a blade axis in order to generate an airflow. A housing is disposed about said fan blades and defines a free area through which the airflow can travel. A first end of the housing is proximate to said plurality of fan blades. A second end of the housing has a free area that is unevenly distributed about the blade axis.

15 Claims, 3 Drawing Sheets

AIR MOVER

CROSS-REFERENCE TO A RELATED APPLICATION

The present application claims the benefit of, and incorporates by reference, provisional application Ser. No. 60/573,508, filed May 21, 2004, and entitled "Larger Blade Area Air Mover With Externally Mounted Motor Or Eccentricized Output."

BACKGROUND

Computer systems include numerous electrical components that draw electrical current to perform their intended functions. For example, a computer's microprocessor or central processing unit ("CPU") requires electrical current to perform many functions such as controlling the overall operations of the computer system and performing various numerical calculations. Generally, any electrical device through which electrical current flows produces heat. The amount of heat any one device generates generally is a function of the amount of current flowing through the device.

Typically, an electrical device is designed to operate correctly within a predetermined temperature range. If the temperature exceeds the predetermined range (i.e., the device becomes too hot or too cold), the device may not function correctly, thereby potentially degrading the overall performance of the computer system. Thus, many computer systems include cooling systems to regulate the temperature of their electrical components. One type of cooling system is a forced air system that relies on one or more air movers to blow air over the electronic components in order to cool the components.

The cubic feet per minute ("CFM") of air that can be moved across an electric device is an important factor in how much heat can be removed from the device. Thus, the capacity of an air mover is a critical factor in selecting an air mover for use in a cooling application. The CFM that an air mover can produce is governed by total area of the blades generating the airflow and the free area provided for airflow through the air mover. The free area is defined as the cross-sectional area available to the airflow as it travels through the air mover. The total area of the blades is the cross-sectional area of the airflow as it passes through the rotating blades. In order to minimize choking of the airflow, the total area of the blades is often limited to the minimum free area of the airflow.

In many computer applications, the diameter of an air mover, and thus the CFM that it can produce, is limited by the height available within the computer chassis. Therefore, as can be appreciated there remains a need in the art for air movers that provide high volumes of airflow with limited heights.

BRIEF SUMMARY

The problems noted above are solved in large part by an air mover comprising a motor and a plurality of fan blades coupled to the motor. The motor is operable to rotate the fan blades about a blade axis in order to generate an airflow. A housing is disposed about said fan blades and defines a free area through which the airflow can travel. A first end of the housing is proximate to said plurality of fan blades. A second end of the housing has a free area that is unevenly distributed about the blade axis.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct mechanical connection. Thus, if a first device couples to a second device, that connection may be through a direct mechanical connection, or through an indirect mechanical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Often, the most effective arrangement for arranging an electric fan driven is to position the motor in line with the blades. As the motor is in-line with the blades, the motor is often positioned within the airflow. Having the motor in the airflow helps control the temperature of the motor, but also reduces the available free area in a housing. Because the area of the blades is often limited by the free area in the housing, reducing the free area reduces the maximum blade area. Although the free area and blade area could be increased by increasing the diameter of the air mover housing, this is often not possible in applications where the size of an air mover is limited by the chassis or some other feature.

Figure 1:
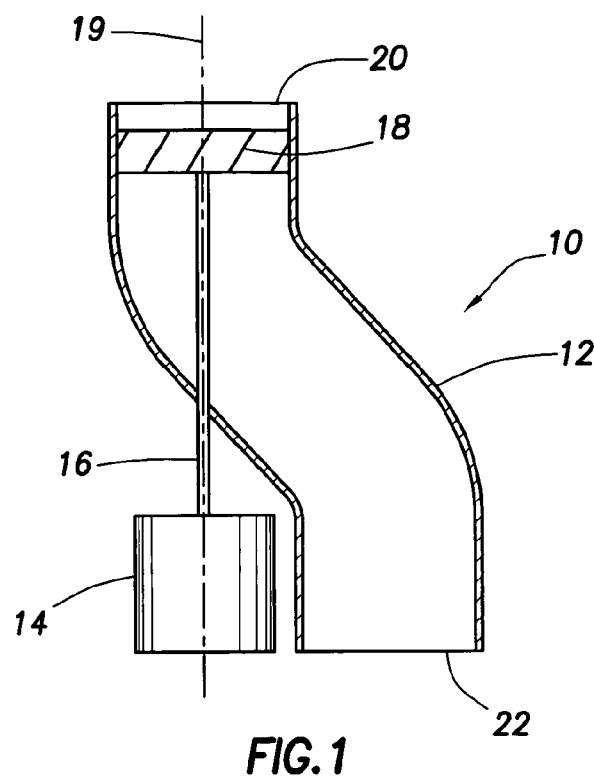
FIG. 1 shows a partial sectional top view of one embodiment of an air mover constructed in accordance with the present invention.
Figure 2:
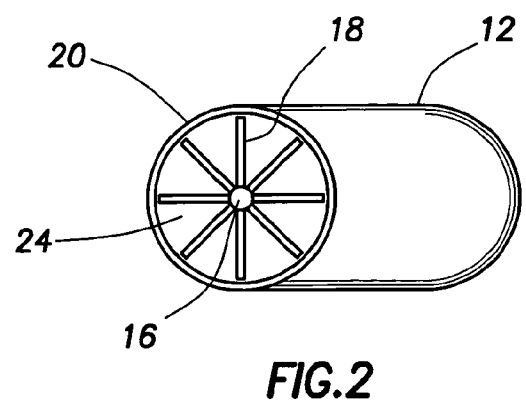
FIG. 2 shows a front view of the air mover of FIG. 1.
Figure 3:
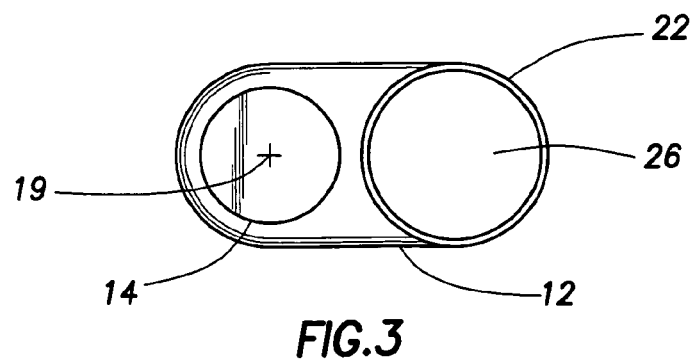
FIG. 3 show a rear view of the air mover of FIG. 1.

Referring now to FIGS. 1–3, air mover assembly 10 comprises housing 12, motor 14, shaft 16, and fan blades 18. Housing 12 further comprises first end 20 and second end 22. It is understood that the first and second ends may be either the inlet or outlet of air mover 10, depending on the direction in which blades 18 rotate. Motor 14 is positioned outside of housing 12 and therefore outside of the airflow. Motor 14 is coupled to fan blades 18 by shaft 16, which penetrates the wall of housing 12. Blades 18 are substantially perpendicular to and rotate about a blade axis 19, which also passes through the center of shaft 16 and motor 14.

Housing 12 defines the outer limits of the cross-sectional free area through which the airflow travels. At first end 20, housing 12 has a circular perimeter wherein the walls of the housing are equally spaced from blade axis 19. Thus, first end 20 has a free area 24 that is evenly distributed about blade axis 19 and is effectively equal to the cross-sectional area of housing 12 less the cross-sectional area of shaft 16.

Housing 12 is formed such that second end 22 has a perimeter defining a cross-sectional area that is offset from blade axis 19 so that motor 14 is outside of the housing. Therefore, second end 22 can have a free area 26 that is substantially equal to free area 24 at first end 20. Because motor 14 is positioned along blade axis 19, the perimeter of second end 22 is offset from blade axis 19 and free area 26 is unevenly distributed about the blade axis.

Removing motor 14 from the airflow results in a free area through housing 12 that is only limited by the inner diameter of housing 12 and the diameter of shaft 16. Therefore, for a given blade diameter, air mover 10 can have a larger total blade area and provide an airflow with an increased CFM. In other embodiments, the motor may remain within the housing but the shape of the housing allows an unrestricted airflow. For example, the housing of FIGS. 1–3 may be expanded to surround motor 14 as long as the total free area at second end 22 is approximately equal to the free area at first end 20.

Figure 4:
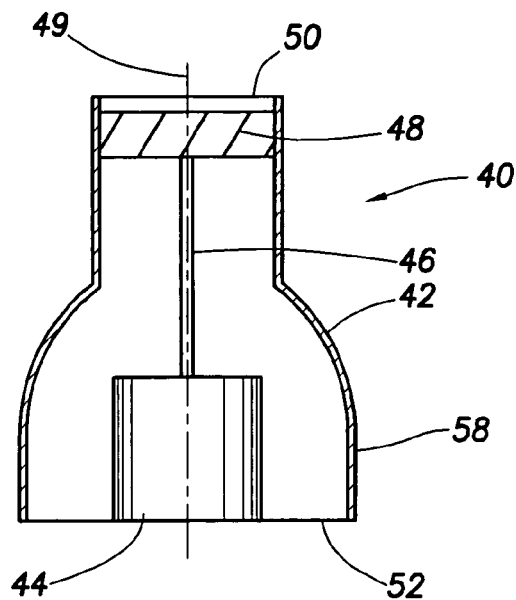
FIG. 4 shows a partial sectional top view of another embodiment of an air mover constructed in accordance with the present invention.
Figure 5:
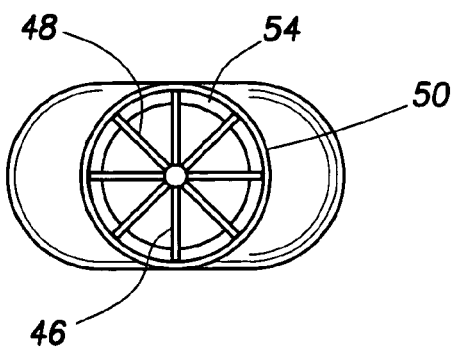
FIG. 5 shows a front view of the air mover of FIG. 4.
Figure 6:
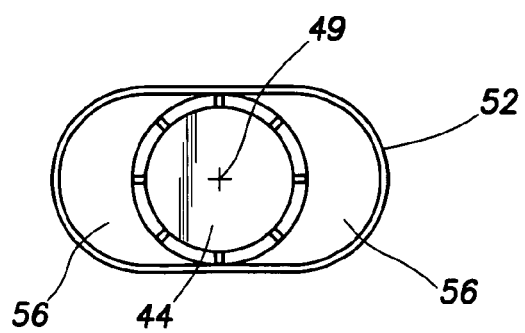
FIG. 6 shows a rear view of the air mover of FIG. 4.

Referring now to FIGS. 4–6, air mover assembly 40 comprises housing 42, motor 44, shaft 46, and fan blades 48. Housing 42 further comprises first end 50 and second end 52, it is understood that the first and second ends may be either the inlet or outlet of air mover 40, depending on the direction in which blades 48 rotate. Motor 44 is connected to fan blades 48 by shaft 46. Blades 48 are substantially perpendicular to and rotate about a blade axis 49, which also passes through the center of shaft 46 and motor 44. Motor 44 is positioned inside housing 42 but within an expanded region 58 that provides an expanded free area for the airflow.

Housing 42 defines the outer limits of the cross-sectional free area through which the airflow travels. At first end 50, housing 42 has a circular perimeter wherein the walls of the housing are equally spaced from blade axis 49. Thus, first end 50 has a free area 54 that is evenly distributed about blade axis 49 and is effectively equal to the cross-sectional area of housing 42 less the cross-sectional area of shaft 46.

Housing 42 is formed with an expanded region 58 such that second end 52 has an perimeter defining a cross-sectional area that is larger than the cross-sectional area of first end 50. Expanded region 58 and second end 52 may have a variety of cross-sectional shapes, such as oval, elliptical, or multi-faceted. In one example, the height of the cross-section of housing is maintained between first end 50 and second end 52 so that the air mover would fit in the same height chassis as a similar-sized fan having a constant-diameter cylindrical housing.

The cross-sectional area of second end 52 is approximately equal to the free area 54 of first end 50 plus the cross-sectional area of motor 44. Therefore, second end 52 can have a free area 56 that is substantially equal to free area 54 at first end 50. Because the perimeter of second end 52 is no longer circular, the perimeter is offset from blade axis 49 and free area 56 is unevenly distributed about the blade axis. Free area 56 may have an oval cross-section, as shown in FIG. 6, or may have any other desirable shape that provides an uneven distribution about the blade axis.

Figure 7:
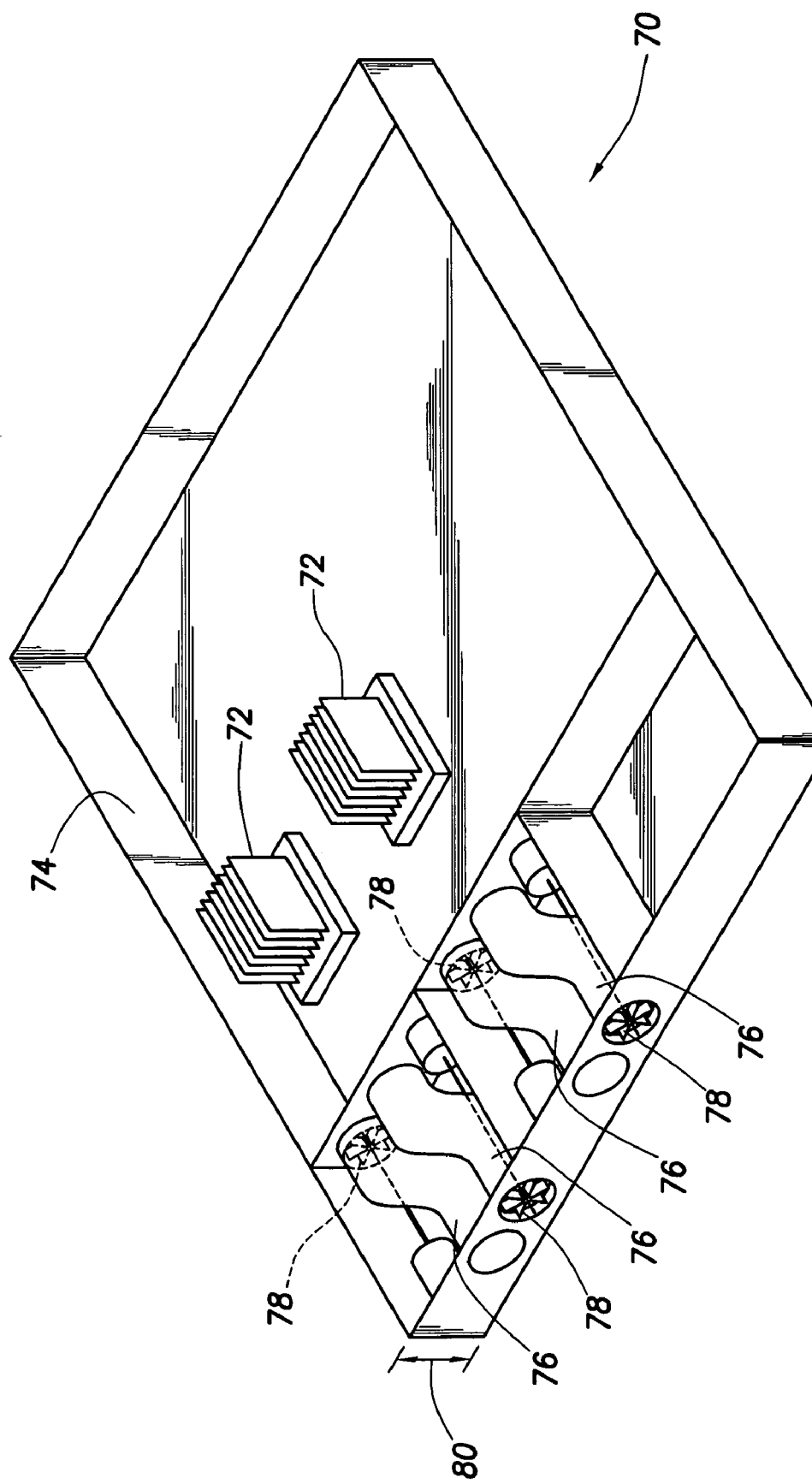
FIG. 7 shows a rack-mounted server utilizing air movers constructed in accordance with embodiments of the present invention.

The embodiments described herein provide an air mover that supplies a greater rate of flow for a given fan diameter. This may especially be useful in cooling solutions for rack-mounted servers. Referring now to FIG. 7, server 70 comprises electronic components 72 mounted in a chassis 74. Server 70 also comprises a plurality of air movers 76 that help to regulate the temperature of electronic components 72 by providing an airflow across the components. Air movers 76 each comprise rotating fan blades 78 that are rotated to generate the airflow.

The diameter of fan blades 78 is limited by the height 80 of chassis 74. Therefore, larger diameter air movers, which can provide increased airflow, can not be used due to size limitations. In order to provide increased airflow, air movers 76 are arranged such that the free area through the air mover is unevenly distributed about the rotational axis of the blade, thus allowing the airflow generated by the air mover to be increased.

The above discussion is meant to be illustrative of the principles and various embodiments of the present invention. Numerous variations and modifications will become apparent to those skilled in the art once the above disclosure is fully appreciated. For example, air movers of different sizes, shapes, and configurations may utilize the principles of the present invention. It is intended that the following claims be interpreted to embrace all such variations and modifications.

What is claimed is:

1. An air mover comprising:
a motor;
a plurality of fan blades coupled to said motor, wherein said motor is operable to rotate said fan blades about a blade axis in order to generate an airflow through a computer chassis, wherein the computer chassis has a height that is greater than a diameter of said plurality of fan blades;
a housing disposed about said fan blades, wherein said housing defines a free area through which the airflow can travel, wherein said housing is disposed within the computer chassis;
a first end of said housing proximate to said plurality of fan blades;
a second end of said housing, wherein the free area at the second end of said housing is unevenly distributed about the blade axis, wherein the airflow is generally parallel to the blade axis and said motor is disposed outside of said housing; and
a shaft connecting said plurality of fan blades to said motor, wherein said shaft extends through a wall of said housing.

2. The air mover of claim 1 wherein the free area at said first end of said housing is evenly distributed about the blade axis.

3. The air mover of claim 1 wherein said second end is offset from said first end.

4. The air mover of claim 1 wherein said second end has an oval cross-section.

5. The air mover of claim 1 wherein said second end has a cross-sectional area approximately equal to the free area at said first end plus a cross-sectional area of said motor.

6. The air mover of claim 1 wherein said motor is disposed proximate to said second end.

7. An air mover comprising:
- a housing comprising a first end and a second end, wherein said housing is mounted within a computer chassis;
- a plurality of fan blades disposed proximate to the first end of said housing, wherein said fan blades are arranged substantially perpendicular to a blade axis, wherein said plurality of fan blades have a blade diameter less than a height of the computer chassis;
- a motor coupled to said fan blades and operable to rotate said fan blades about the blade axis, wherein the second end of said housing has a perimeter that is offset from the blade axis, the second end has a circular perimeter that is offset from the blade axis, and said motor is disposed outside of said housing; and
- a shaft connecting said plurality of fan blades to said motor, wherein said shaft extends through a wall of said housing.

8. The air mover of claim 7 wherein the first end of said housing has a circular perimeter that is equally spaced from the blade axis.

9. The air mover of claim 7 wherein the second end has an oval perimeter.

10. The air mover of claim 9 wherein the perimeter of the second end defines a cross-sectional area approximately equal to the cross-sectional area defined by the perimeter of the first end plus a cross-sectional area of said motor.

11. The air mover of claim 12 wherein said motor is disposed proximate to the second end.

12. A method for generating an airflow through a computer chassis comprising:
- rotating a plurality of fan blades about a blade axis so as to generate an airflow moving through a housing that is disposed within the computer chassis, wherein the fan blades are substantially perpendicular to the blade axis and have a blade diameter less than a height of the computer chassis;
- moving the airflow through a first end of the housing; and
- moving the airflow through a second end of the housing that defines a free area that is unevenly distributed about the blade axis, wherein the second end is offset from the blade axis and the plurality of fan blades are rotated by a motor disposed outside of the housing and coupled to the fan blades by a shaft extending through a wall of the housing.

13. The method of claim 12 wherein the first end of the housing defines a free area that is evenly distributed about the blade axis.

14. The method of claim 12 wherein the motor disposed proximate to the second end of the housing.

15. The method of claim 14 wherein the second end has an oval cross-section area approximately equal to the free area at said first end plus a cross-sectional area of said motor.

* * * * *

UNITED STATES PATENT AND TRADEMARK OFFICE
CERTIFICATE OF CORRECTION

| | | |
|---|---|---|
| PATENT NO. | : 7,056,204 B2 | |
| APPLICATION NO. | : 11/042421 | |
| DATED | : June 6, 2006 | |
| INVENTOR(S) | : Wade D. Vinson et al. | |

It is certified that error appears in the above-identified patent and that said Letters Patent is hereby corrected as shown below:

On the title page, item (75), in "Inventors", in column 1, line 3,
after "(US)" insert -- ; Rich Bargerhuff, Spring, TX (US) --.

In column 5, line 28, in Claim 11, delete "claim 12" and insert -- claim 7 --, therefor.

In column 6, line 22, in Claim 14, after "motor" insert -- is --.

Signed and Sealed this

Twenty-eighth Day of July, 2009

JOHN DOLL
*Acting Director of the United States Patent and Trademark Office*